(12) United States Patent
Jung

(10) Patent No.: US 6,342,796 B2
(45) Date of Patent: Jan. 29, 2002

(54) DELAY LOCKED LOOP HAVING FAST LOCKING TIME

(75) Inventor: Hea-Suk Jung, Ichon-shi (KR)

(73) Assignee: Hyundai Electronics Industries Co., Ltd., Ichon-Shi (KR)

( * ) Notice: Subject to any disclaimer, the term of this patent is extended or adjusted under 35 U.S.C. 154(b) by 0 days.

(21) Appl. No.: 09/742,276

(22) Filed: Dec. 19, 2000

(30) Foreign Application Priority Data

Dec. 24, 1999 (KR) .............................. 99-62250

(51) Int. Cl.[7] ................................ H03L 7/00
(52) U.S. Cl. ................ 327/141; 327/155; 327/161
(58) Field of Search ......................... 327/141, 155, 327/156, 158, 161; 365/194, 233

(56) References Cited

U.S. PATENT DOCUMENTS

| | | | | |
|---|---|---|---|---|
| 5,815,016 A | * | 9/1998 | Erickson | 327/158 |
| 6,064,244 A | * | 5/2000 | Wakayama et al. | 327/158 |
| 6,069,506 A | * | 5/2000 | Miller, Jr. et al. | 327/156 |
| 6,100,736 A | * | 8/2000 | Wu et al. | 327/161 |
| 6,208,183 B1 | * | 3/2001 | Li et al. | 327/161 |
| 6,229,363 B1 | * | 5/2001 | Eto et al. | 327/158 |

* cited by examiner

Primary Examiner—Trong Phan
(74) Attorney, Agent, or Firm—Townsend and Townsend and Crew LLP

(57) ABSTRACT

A delay locked loop (DLL) for use in a synchronous memory device includes: a first shift controller for generating a first shift-right signal in response to a first comparison signal; a first shift register for performing only a shift-right operation in response to the first shift-right signal; a first delay line unit for controlling each delay amount of internal signals in response to an output of the first shift register, wherein the first delay line unit includes a plurality of delay lines, each delay line having a first unit delay; a second shift controller for generating a second shift-right signal and a shift-left signal in response to a second comparison signal; a second shift register for performing a shift-right operation and a shift-left operation in response to the second shift-right signal and the shift-left signal, respectively; and a second delay line unit for controlling each delay amount of output signals of the first delay line means, wherein the second delay line unit includes a plurality of delay lines, each delay line having a second unit delay smaller than the first unit delay.

9 Claims, 6 Drawing Sheets

DELAY LOCKED LOOP HAVING FAST LOCKING TIME

FIELD OF THE INVENTION

The present invention relates to a semiconductor memory device; and, more particularly, to a delay locked loop having a fast locking time.

DESCRIPTION OF THE PRIOR ART

For achieving a high speed operation in a semiconductor memory device, a synchronous dynamic access memory (SDRAM) has been developed. The SDRAM operates in synchronization with an external clock. The SDRAM includes a single data rate (SDR) SDRAM, a double data rate (DDR) SDRAM, and the like.

Generally, when data are outputted in synchronization with the external clock, a skew between the external clock signal and the output data is occurred. In the SDRAM, a delay locked loop (DLL) can be used to compensate for the skew between an external clock and an output data, or an external clock and an internal clock.

FIG. 1 is a block diagram showing a conventional delay locked loop.

Referring to FIG. 1, the conventional delay locked loop includes a clock buffer 100, a clock divider 110, a phase comparator 120, a shift controller 130, a shift register 140, a delay line unit 150, a delay model 160 and a DLL signal driver 170.

The clock buffer 100 generates a rising clock RCLK and a falling clock FCLK in response to a rising edge and a falling edge of an external clock CLK, respectively.

The clock divider 110 generates a first pulse signal DELAY_IN and a second pulse signal REF. The first pulse signal DELAY_IN is generated at every 8 external clocks in response to the rising clock RCLK and has a pulse width corresponding to one period of the external clock CLK. The second pulse signal REF is obtained by inverting the first pulse signal DELAY_IN.

The phase comparator 120 compares a phase of the second pulse signal REF with that of a feedback signal FEEDBACK outputted from the delay model 160 to thereby output a comparison signal PC<0:3>.

In response to the comparison signal PC<0:3>, the shift controller 130 generates a shift-right signal SR and a shift-left signal SL for determining a shift direction. The shift register 140 performs a shift-right operation and a shift-left operation in response to the shift-right signal SR and the shift-left signal SL, respectively.

The delay line unit 150 includes a first to a third delay lines 151 to 153 for controlling each delay amount of the falling clock FCLK, the rising clock RCLK and the first pulse signal DELAY_IN, respectively. The first to third delay lines 151 to 153 generate a first to a third delayed signals FCLK_DLL, RCLK_DLL and FEEDBACK_DLY, respectively. The delay line unit 150 is implemented a plurality of unit delay circuits.

The delay model 160 compensates a skew between the external clock CLK and the internal clocks according to the third delayed signal FEEDBACK_DLY. An output of the delay model 160 is fed back to the phase comparator 120. The DLL signal driver 170 drives the first and the second delayed signals FCLK_DLL and RCLK_DLL signal.

At this time, in case where pulse widths of the second pulse signal REF, the unit delay circuit and the delay model are respectively 5 nsec, 0.2 nsec and 5 nsec, a pulse width of the feedback signal FEEDBACK becomes 5.2 nsec. Thus, the feedback signal FEEDBACK is generated later than the second pulse signal REF. In this case, the phase comparator 120 must generates a shift-left signal SL from the beginning. However, the delay line unit 150 cannot perform a shift-left operation from the beginning, so that it is impossible to obtain desired internal clocks.

Additionally, since the unit delay circuit contained in the delay line unit 150 has a small unit delay of about 0.2 nsec, it takes a long time to compare a phase of the second pulse signal REF with that of the feedback signal FEEDBACK in order to obtain a locking.

SUMMARY OF THE INVENTION

It is, therefore, an object of the present invention to provide a delay locked loop having a fast locking time.

In accordance with an aspect of the present invention, there is provided a delay locked loop (DLL) for use in a synchronous memory device, comprising: a first shift control means for generating a first shift-right signal in response to a first comparison signal; a first shift register for performing only a shift-right operation in response to the first shift-right signal; a first delay line means for controlling each delay amount of internal signals in response to an output of the first shift register, wherein the first delay line means includes a plurality of delay lines, each delay line having a first unit delay; a second shift control means for generating a second shift-right signal and a shift-left signal in response to a second comparison signal; a second shift register for performing a shift-right operation and a shift-left operation in response to the second shift-right signal and the shift-left signal, respectively; and a second delay line means for controlling each delay amount of output signals of the first delay line means, wherein the second delay line means includes a plurality of delay lines, each delay line having a second unit delay smaller than the first unit delay.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1:
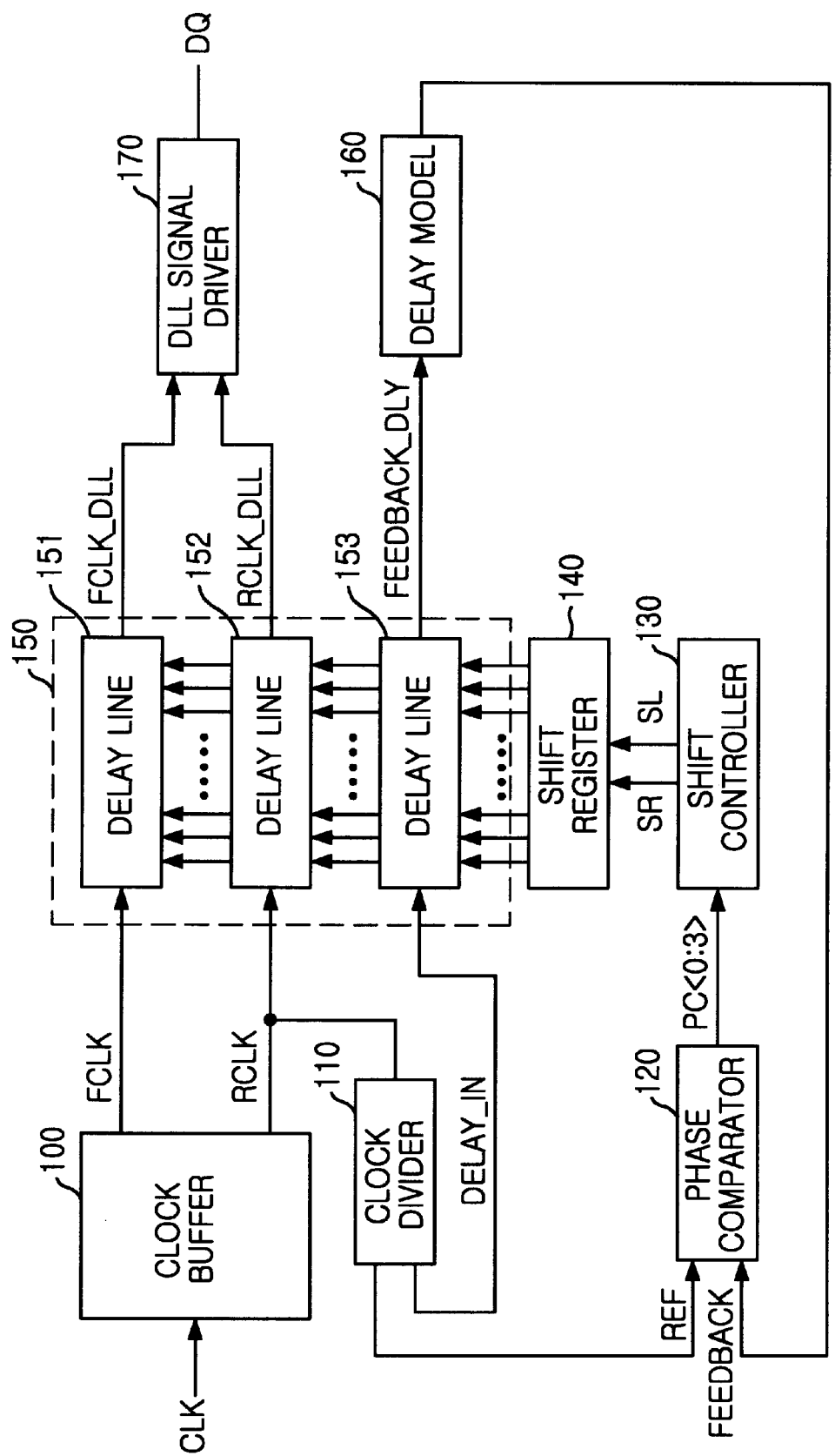
FIG. 1 is a block diagram showing a conventional delay locked loop.
Figure 2:
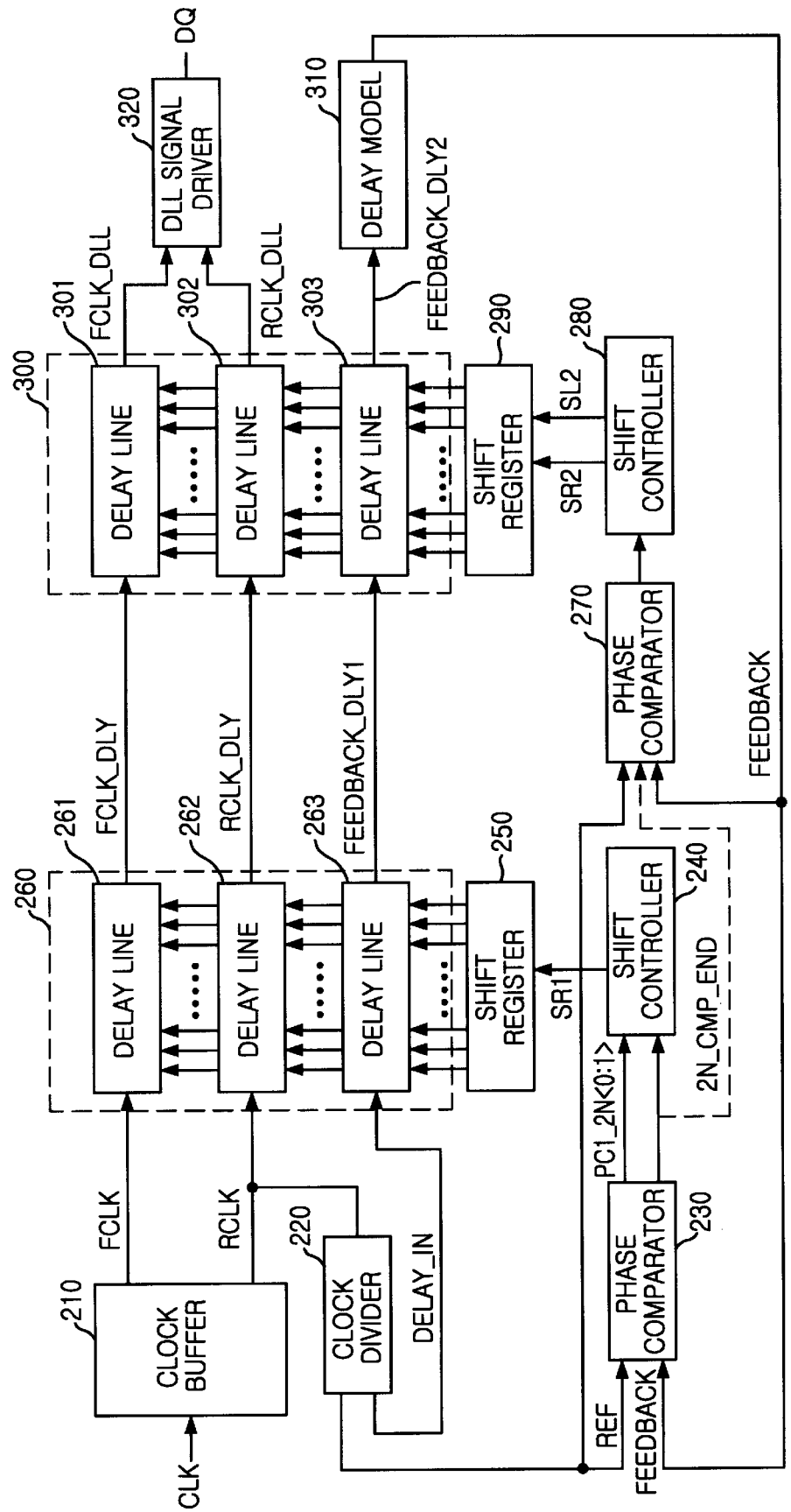
FIG. 2 is a block diagram illustrating a delay locked loop in accordance with the present invention.

FIG. 2 is a block diagram illustrating a delay locked loop (DLL) in accordance with the present invention.

Referring to FIG. 2, the delay locked loop (DLL) in accordance with the present invention includes a clock buffer 210, a clock divider 220, a first phase comparator 230, a first shift controller 240, a first shift register 250, a first delay line unit 260, a second phase comparator 270, a second shift controller 280, a second shift register 290, a second delay line unit 300, a delay model 310 and a DLL signal driver 320.

The clock buffer 210 generates a falling clock FCLK and a rising clock RCLK in response to a falling edge and a rising edge of an external clock CLK, respectively.

The clock divider 220 generates a first pulse signal DELAY_IN and a second pulse signal REF in response to the rising clock RCLK. The first pulse signal DELAY_IN is generated at every 4 external clocks in response to the rising clock RCLK and has a pulse width corresponding to two periods of the external clock CLK. The second pulse signal REF is obtained by inverting the first pulse signal DELAY_IN.

The first phase comparator 230 compares a phase of the second pulse signal REF with that of a feedback signal FEEDBACK outputted from the delay model 310 to thereby output a first comparison signal PC1_2N<0:1>.

The first shift controller 240 generates a shift-right signal SR1 for determining a shift direction in response to the first comparison signal PC1_2N<0:1>.

The first shift register 250 performs only a shift-right operation in response to the shift-right signal SR1 outputted from the first shift controller 240.

The first delay line unit 260 includes a first to a third delay lines 261 to 263 for controlling each delay amount of the falling clock FCLK, the rising clock RCLK and the first pulse signal DELAY_IN, respectively. The first to third delay lines 261 to 263 generate a delayed falling clock FCLK_DLY, a delayed rising clock RCLK_DLY and a delayed feedback signal FEEDBACK_DLY1, respectively. Each of the delay lines 261 to 263 contained in the first delay line unit 260 is implemented a plurality of unit delay circuits each of which has a large unit delay.

The second phase comparator 270 compares a phase of the second pulse signal REF and that of the feedback signal FEEDBACK to thereby generate a second comparison signal PC2_2N<0:3>.

The second shift controller 280 generates a shift-right signal SR2 and a shift-left signal SL2 for determining a shift direction in response to the second comparison signal PC2_2N<0:3>.

The second shift register 290 performs a shift-right operation and a shift-left in response to the shift-right signal SR2 and the shift-left signal SL2 outputted from the second shift controller 280, respectively.

The second delay line unit 300 includes a fourth to a sixth delay lines 301 to 303 for controlling each delay amount of the delayed signals FCLK_DLY, RCLK_DLY and FEEDBACK_DLY1, respectively. The fourth to the sixth delay lines 301 to 303 generate a falling DLL signal FCLK_DLL, a rising DLL signal RCLK_DLL and a second delayed feedback signal FEEDBACK_DLY2, respectively. Each of the delay lines 301 to 303 contained in the second delay line unit 300 is implemented a unit delay circuit having a small unit delay.

The delay model 310 compensates a skew between the external clock CLK and the internal clocks according to the second delayed feedback signal FEEDBACK_DLY2. An output of the delay model 310 is fed back to the first and the second phase comparators 230 and 270.

The DLL signal driver 320 buffers the falling DLL signal FCLK_DLL and the rising DLL signal RCLK_DLL to generate buffered DLL signals as the internal clocks.

Figure 3:
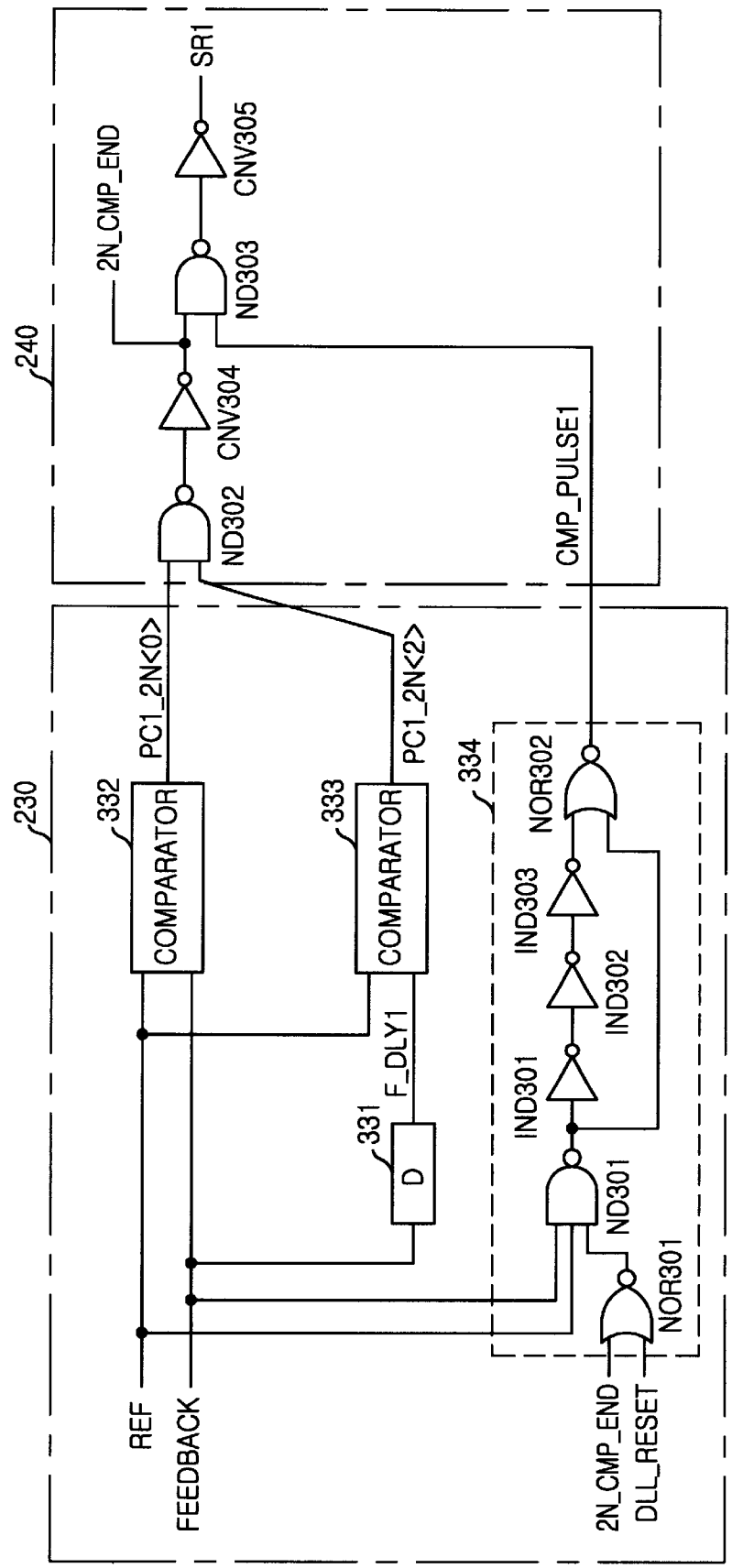
FIG. 3 is a schematic diagram illustrating a first phase comparator and a first shift controller shown in FIG. 2.
Figure 4:
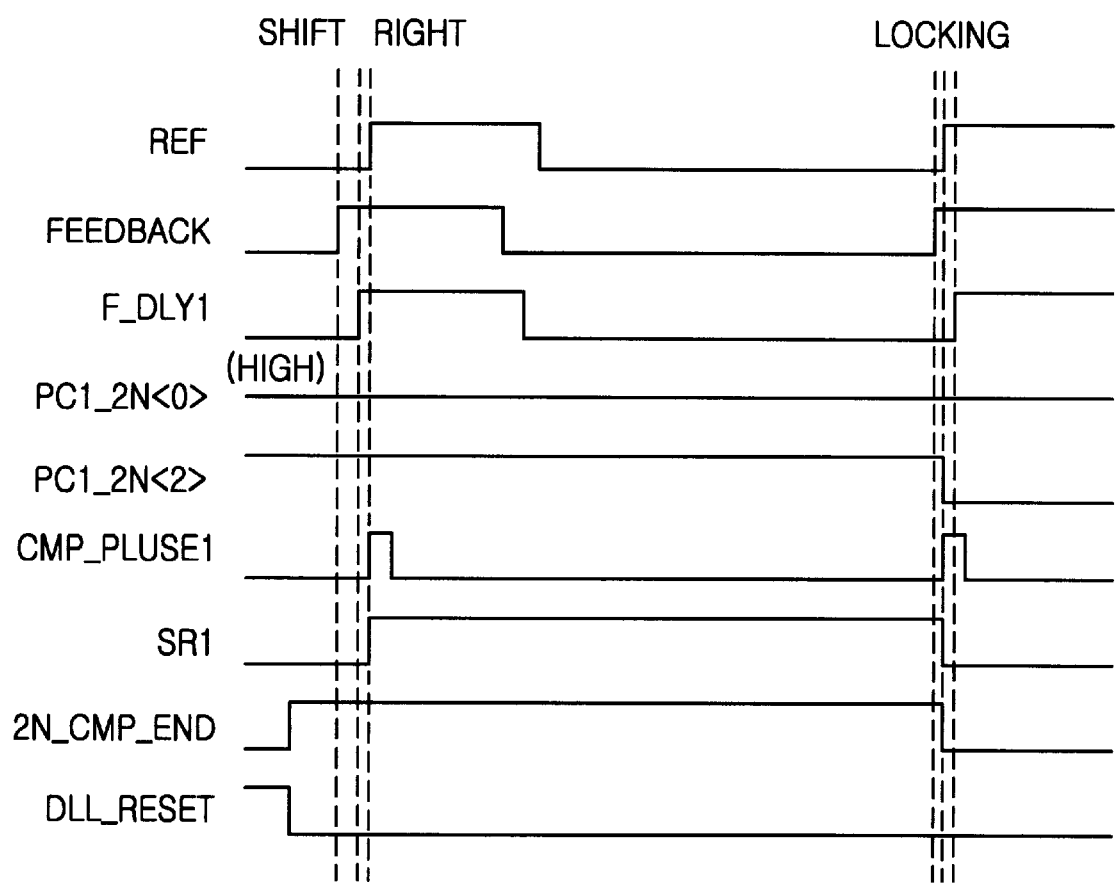
FIG. 4 illustrates a timing chart of the first phase comparator and the first shift controller shown in FIG. 3.

FIG. 3 is a schematic diagram illustrating the first phase comparator 230 and the first shift controller 240 shown in FIG. 2, and FIG. 4 illustrates a timing chart of the first phase comparator 230 and the first shift controller 240.

Referring to FIGS. 3 and 4, the first phase comparator 230 includes a unit delay circuit 331 for delaying the feedback signal FEEDBACK to generate a delayed feedback signal F_DLY1, a first comparator 332 for comparing a phase of the second pulse signal REF with that of the feedback signal FEEDBACK to thereby output a comparison signal PC1_2N<0>, a second comparator 333 for comparing a phase of the second pulse signal REF with that of the delayed feedback signal F_DLY1 to output a comparison signal PC1_2N<2>, and a comparison control unit 334 for performing a logic operation of the second pulse signal REF, the feedback signal FEEDBACK, a control signal 2N_CMP_END and a DLL reset signal DLL_RESET to thereby generate a comparison control signal CMP_PULSE1.

The comparison control unit 334 also includes a NOR gate NOR301 for NORing the control signal 2N_CMP_END and the DLL reset signal DLL_RESET, a NAND gate ND301 for NANDing the second pulse signal REF, the feedback signal FEEDBACK and an output of the NOR gate NOR301, a plurality of inverters INV301 to INV303 for inverting and delaying an output of the NAND gate ND301, and a NOR gate NOR302 for NORing an output of the inverter INV303 and the output of the NAND gate ND301 to generate the comparison control signal CMP_PULSE1.

The first shift controller 240 includes a NAND gate ND302 for NANDing the comparison signals PC1_2N<0> and PC1_2N<2>, an inverter INV304 for inverting an output of the NAND gate ND302 to generate the control signal 2N_CMP_END, a NAND gate ND303 for NANDing an output of the inverter INV304 and the comparison control signal CMP_PULSE1, and an inverter INV305 for inverting an output of the NAND gate ND303 to generate the shift-right signal SR1.

In case where both the feedback signal FEEDBACK and the delayed feedback signal F_DLY1 precede the second pulse signal REF, the first shift controller 240 generates the shift-right signal SR1. In case where the feedback signal FEEDBACK precedes the second pulse signal REF and the delayed feedback signal F_DLY1 follows the second pulse signal REF, a locking is completed.

Figure 5:
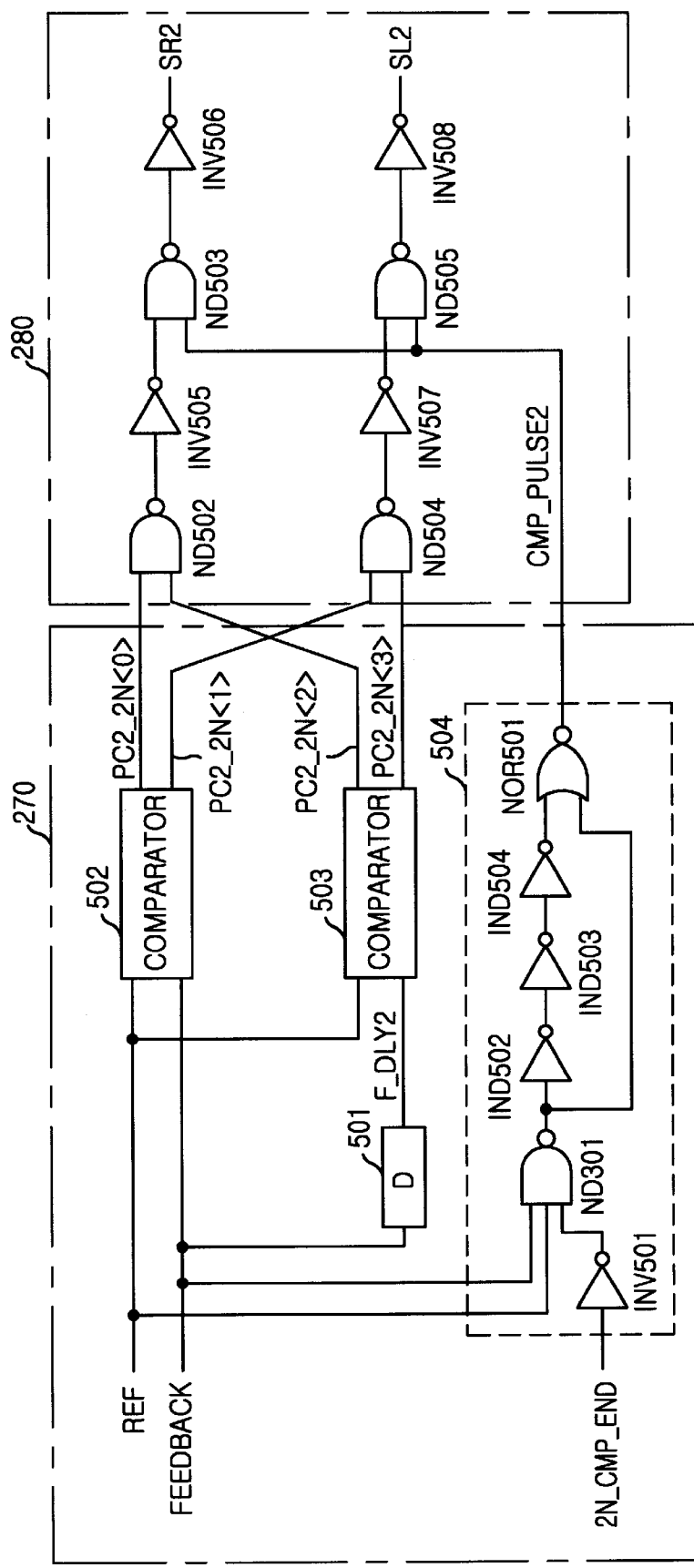
FIG. 5 is a schematic diagram illustrating a second phase comparator and a second shift controller shown in FIG. 2.
Figure 6:
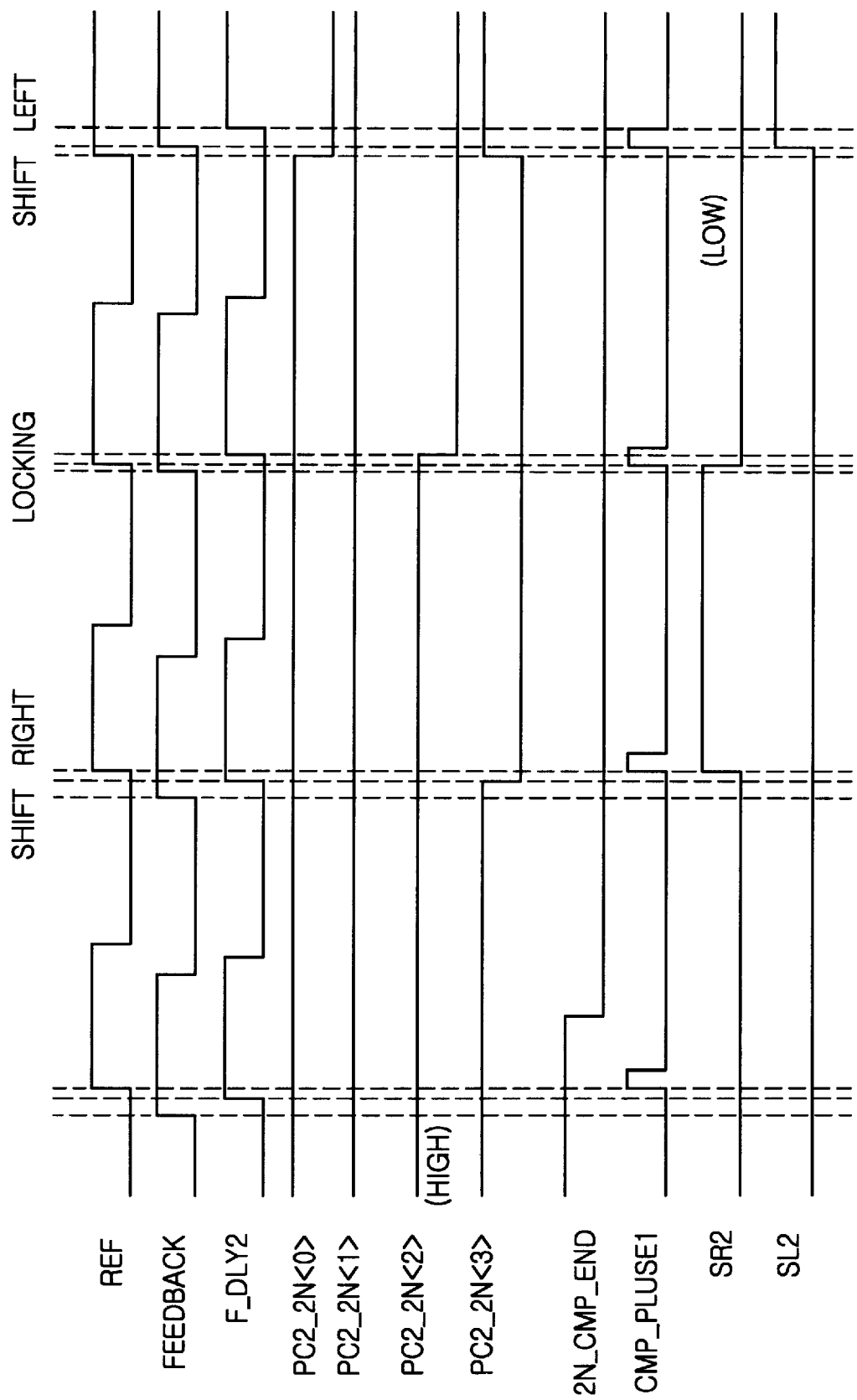
FIG. 6 illustrates a timing chart of the second phase comparator and the second shift controller shown in FIG. 5.

FIG. 5 is a schematic diagram illustrating the second phase comparator 270 and the second shift controller 280 shown in FIG. 2, and FIG. 6 illustrates a timing chart of the second phase comparator 270 and the second shift controller 280.

Referring to FIGS. 5 and 6, the second phase comparator 270 includes a unit delay circuit 501 for delaying the feedback signal FEEDBACK to generate a delayed feedback signal F_DLY2, a first comparator 502 for comparing a phase of the second pulse signal REF with that of the feedback signal FEEDBACK to output comparison signals PC2_2N<0> and PC2_2N<1>, a second comparator 503 for comparing a phase of the second pulse signal REF with that of the delayed feedback signal F_DLY2 to output comparison signals PC2_2N<2> and PC<3>, and a comparison control unit 504 for performing a logic operation of the second pulse signal REF, the feedback signal FEEDBACK and an inverted signal of the control signal 2N_CMP_END to generate a comparison control signal CMP_PULSE2.

The comparison control unit 504 also includes a NAND gate ND501 for NANDing the second pulse signal REF, the feedback signal FEEDBACK and the inverted signal of the control signal 2N_CMP_END, a plurality of inverters INV502 to INV504 for inverting and delaying an output of the NAND gate ND501, and a NOR gate NOR501 for NORing an output of the inverter INV303 and the output of the NAND gate ND501 to generate the comparison control signal CMP_PULSE2.

The second shift controller 280 includes a NAND gate ND502 for NANDing the comparison signals PC2_2N<0> and PC2_2N<2>, an inverter INV505 for inverting an output of the NAND gate ND502, a NAND gate ND503 for NANDing an output of the inverter INV505 and the comparison control signal CMP_PULSE2, an inverter INV506 for inverting an output of the NAND gate ND503 to generate the shift-right signal SR2, a NAND gate ND504 for NANDing the comparison signals PC2_2N<1> and PC2_2N<3>, an inverter INV507 for inverting an output of the NAND gate ND504, a NAND gate ND505 for NANDing an output of the inverter INV507 and the comparison control signal CMP_PULSE2, and an inverter INV508 for inverting an output of the NAND gate ND505 to generate the shift-left signal SL2.

At this time, the comparison control unit 504 generates the comparison control signal CMP_PULSE2 when the second pulse signal REF and the feedback signal FEEDBACK are simultaneously high levels. Then, the second shift controller 280 generates the shift-right signal SR2 and the shift-left signal SL2 in response to the comparison signals PC2_2N<0:3>. The control signal 2N_CMP_END is a signal for indicating the starting of this operation.

When the internal clocks have a delay of 2 nsec, the control signal 2N_CMP_END has a low level. After completing the compensation of the skew through the first delay line unit 260, the skew is compensated through the second delay line unit 300.

As described above, by using the pulse signal with twice the periods of the external clock, it is possible to perform a locking operation in a high frequency. Additionally, a locking time is shorten by using a first delay line unit having a large delay and a second delay line unit having a small delay.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A delay locked loop (DLL) for use in a synchronous memory device, comprising:
   a first shift control means for generating a first shift-right signal in response to a first comparison signal;
   a first shift register for performing only a shift-right operation in response to the first shift-right signal;
   a first delay line means for controlling each delay amount of internal signals in response to an output of the first shift register, wherein the first delay line means includes a plurality of delay lines, each delay line having a first unit delay;
   a second shift control means for generating a second shift-right signal and a shift-left signal in response to a second comparison signal;
   a second shift register for performing a shift-right operation and a shift-left operation in response to the second shift-right signal and the shift-left signal, respectively; and
   a second delay line means for controlling each delay amount of output signals of the first delay line means, wherein the second delay line means includes a plurality of delay lines, each delay line having a second unit delay smaller than the first unit delay.

2. The delay locked loop as recited in claim 1, further comprising:
   a clock buffer means for generating a rising clock and a falling clock in response to an external clock;
   a clock division means for generating a first pulse signal and a second pulse signal in response to the rising clock;
   a first phase comparison means for comparing a phase of the second pulse signal with that of a feedback signal to generate the first comparison signal;
   a second phase comparison means for comparing a phase of the second pulse signal with that of the feedback signal to generate the second comparison signal; and
   a delay model means for controlling each delay amount of an output of the second delay line means, wherein an output of the delay model means is fed back to the first phase comparison means and the second phase comparison means.

3. The delay locked loop as recited in claim 2, wherein the first pulse signal is generated at every four external clocks in response to the rising clock and has a pulse width twice the period of the external clock, and wherein the second pulse signal is an inverted first pulse signal.

4. The delay locked loop as recited in claim 3, wherein the first phase comparison means includes:
   a unit delay circuit for delaying the feedback for a predetermined time to generate a delayed feedback signal;
   a first comparator for comparing a phase of the second pulse signal with that of the feedback signal;
   a second comparator for comparing a phase of the second pulse signal with the that of the delayed feedback signal; and
   a comparison control unit for performing a logic operation of the second pulse signal, the feedback signal, a control signal and a reset signal to generate a comparison control signal.

5. The delay locked loop as recited in claim 4, wherein the comparison control unit includes:
   a first NOR gate for NORing the control signal and the reset signal;
   a NAND gate for NANDing the second pulse signal, the feedback signal and an output of the first NOR gate;
   an inversion/delay unit for inverting and delaying an output of the NAND gate; and
   a second NOR gate for NORing an output of the inversion/delay unit and the output of the NAND gate.

6. The delay locked loop as recited in claim 3, wherein the first shift control means includes:
   a second NAND gate for NANDing an output of the first comparator and an output of the second comparator;
   a first inverter for inverting an output of the second NAND gate to generate the control signal;
   a third NAND gate for NANDing an output of the first inverter and an output of the second NOR gate; and
   a second inverter for inverting an output of the third NAND gate to generate the first right-shift signal.

7. The delay locked loop as recited in claim 3, wherein the second phase comparison means includes:

a unit delay circuit for delaying the feedback signal a predetermined time to generate a delayed feedback signal;

a first comparator for comparing a phase of the second pulse signal with that of the feedback signal to generate a first and a second comparison signal;

a second comparator for comparing a phase of the second pulse signal with that of the delayed feedback signal to generate a third and a fourth comparison signal; and a comparison control unit for performing a logic operation of the second pulse signal, the feedback signal and a control signal to generate a comparison control signal.

8. The delay locked loop as recited in claim 7, wherein the comparison control unit includes:

a NAND gate for NANDing the second pulse signal, the feedback signal and the control signal;

an inversion/delay unit for inverting and delaying an output of the NAND gate; and a NOR gate for NORing an output of the inversion/delay unit and the output of the NAND gate to generate the comparison control signal.

9. The delay locked loop as recited in claim 8, wherein the second shift control means includes:

a second NAND gate for NANDing the first comparison signal and the third comparison signal;

a first inverter for inverting an output of the second NAND gate;

a third NAND gate for NANDing an output of the first inverter and the comparison control signal;

a second inverter for inverting an output of the third NAND gate to generate the second shift-right signal;

a fourth NAND gate for NANDing the second comparison signal and the fourth comparison signal;

a third inverter for inverting an output of the fourth NAND gate;

a fifth NAND gate for NANDing an output of the third inverter and the comparison control signal; and a fourth inverter for inverting an output of the fifth NAND gate to generate the shift-left signal.

* * * * *